(12) United States Patent
French et al.

(10) Patent No.: US 8,279,001 B2
(45) Date of Patent: Oct. 2, 2012

(54) PUSH-PULL LINEAR HYBRID CLASS H AMPLIFIER

(75) Inventors: John Barry French, Caledon East (CA); Andrew John Mason, Bolton (CA)

(73) Assignee: Audera Acoustics Inc., Caledon East (CA)

( * ) Notice: Subject to any disclaimer, the term of this patent is extended or adjusted under 35 U.S.C. 154(b) by 0 days.

(21) Appl. No.: 13/173,307

(22) Filed: Jun. 30, 2011

(65) Prior Publication Data

US 2011/0316630 A1    Dec. 29, 2011

Related U.S. Application Data

(63) Continuation of application No. PCT/CA2009/001900, filed on Dec. 29, 2009.

(60) Provisional application No. 61/141,732, filed on Dec. 31, 2008.

(51) Int. Cl.
*H03G 3/20* (2006.01)

(52) U.S. Cl. ........ 330/136; 330/297; 330/263; 330/264; 330/269

(58) Field of Classification Search ................... 330/297, 330/263, 264, 269, 136

See application file for complete search history.

(56) References Cited

U.S. PATENT DOCUMENTS

| | | | | |
|---|---|---|---|---|
| 4,409,559 | A * | 10/1983 | Amada et al. | 330/295 |
| 4,586,002 | A * | 4/1986 | Carver | 330/297 |
| 5,396,194 | A * | 3/1995 | Williamson et al. | 330/297 |
| 6,507,240 | B2 * | 1/2003 | Butler | 330/3 |
| 6,538,514 | B2 * | 3/2003 | Harvey | 330/265 |
| 7,368,992 | B2 * | 5/2008 | Sandquist | 330/264 |

* cited by examiner

*Primary Examiner* — Patricia Nguyen

(74) *Attorney, Agent, or Firm* — Bereskin and Parr LLP/S.E.N.C.R.L., s.r.l.

(57) ABSTRACT

Several push-pull linear hybrid class H amplifiers are disclosed. A split power rail provides a positive supply rail and a negative supply rail in response to a power supply control voltage. A push-pull amplifier stage is powered by the positive and negative supply rails. The amplifier stage receives an input signal and provides a corresponding amplified output signal. A power supply control circuit provides the power supply control voltage in response to the smaller of the positive and negative supply rails, and the input signal.

11 Claims, 13 Drawing Sheets

PUSH-PULL LINEAR HYBRID CLASS H AMPLIFIER

CROSS REFERENCE TO RELATED APPLICATIONS

This application is a continuation of International Patent Application No. PCT/CA2009/001900, filed Dec. 29, 2009, which claims the benefit of U.S. Provisional application 61/141,732, filed on Dec. 31, 2008, both of which are incorporated herein by reference.

FIELD

The described embodiments relate to audio amplifier circuits. More particularly, the described embodiments relate to push-pull linear hybrid class H audio amplifier circuits.

BACKGROUND

Push-pull linear hybrid class H audio amplifiers are often powered by split power supplies that provide positive and negative power supply rails. However, split power supplies typically have poor cross regulation, particularly when the power sources that generate the power supply rails are not equally loaded. For example, if one of the power sources is heavily loaded, but the other power source is lightly loaded then the power sources will not produce power supply rails of the same magnitude. This is typically the result of imperfect coupling of the transformer windings, stray inductance in the transformer and winding resistance.

To compensate for poor cross regulation between the power supply rails, amplifier circuits traditionally include feedback loops that either i) regulate the total voltage of the power supply rails, or ii) regulate either the positive or negative supply rail and hope that the unregulated power supply rail will stay close to the regulated power supply rail.

The problems with these cross regulation compensation methods can be described using the following example. In the exemplary scenario, the audio signal being amplified is a large low frequency sinusoidal signal and at the positive peak of the sinusoid all of the power comes from the first power source. If the total voltage is regulated to 50 V, then the positive power supply rail may be at 20 V and the negative power supply rail may be at −30 V. In this scheme the maximum symmetrical voltage that can be reproduced is only +/−20V.

On the other hand, if the positive supply rail is regulated, for example, even though the positive supply rail may be kept at 25 V through regulation, when the second power source is heavily loaded, the negative supply rail will sag to −20V. Similar to the previous scheme, the maximum symmetrical voltage that can be reproduced is limited to +/−20V.

SUMMARY

In one aspect, the present invention provides an audio amplifier comprising: a first audio input terminal for receiving a first input audio signal; a first push-pull amplifier output stage for receiving the first input audio signal and producing a first amplified output audio signal; a split power supply for producing a positive power supply rail and a negative power supply rail in response to a power supply control voltage, the positive and negative power supply rails providing power to the first push-pull amplifier output stage; and a power supply control circuit for generating the power supply control voltage, the power supply control voltage being based on the smaller of the positive and negative power supply rails and the input audio signal.

In some embodiments, the power supply control voltage cross regulates the positive power supply rail and the negative power supply rail.

In some embodiments, the power supply control circuit comprises: an absolute value block for converting the first input audio signal into a rectified input audio signal; an envelope detector for producing an envelope signal from the rectified input audio signal; a comparator circuit for selecting the smaller of the positive and negative power supply rails; and a differential amplifier for generating the power supply control voltage, the power supply control voltage being the difference between the envelope signal and the selected power supply rail.

In some embodiments, the audio amplifier further comprises a first voltage clamping device for capping the positive power supply rail at a first predetermined threshold, and a second voltage clamping device for capping the negative supply rail at a second predetermined threshold.

In some embodiments, the audio amplifier includes an active switching circuit for balancing the positive and negative power supply rails.

In some embodiments, the audio amplifier includes an imbalance detector for enabling the active switching circuit when at least one of the positive and negative power supply rails exceeds a predetermined threshold.

In some embodiments, the audio amplifier includes: a second audio input terminal for receiving a second input audio signal; and a second push-pull amplifier stage for receiving an inverted version of the second input audio signal and producing a second amplified output audio signal; wherein the power supply control voltage is based on the smaller of the positive and negative power supply rails, and the larger of the first input audio signal and the second input audio signal.

In some embodiments, the power supply control circuit comprises: a first comparator circuit for rectifying the first and second input audio signals and selecting the larger of the rectified signals; an envelope detector for producing an envelope signal from the selected rectified signal; a comparator circuit for selecting the smaller of the positive and negative power supply rails; and a differential amplifier for generating the power supply control voltage, the power supply control voltage being the difference between the envelope signal and the selected power supply rail.

In some embodiments, the audio amplifier includes a pre-processing circuit for: filtering the first audio input signal into a first high frequency signal and a first low frequency signal; filtering the second audio input signal into a second high frequency signal and a second low frequency signal; combining the first low frequency signal and the second low frequency signal to produce a total low frequency signal; and adding the total low frequency signal to the first and second high frequency signals to produce modified first and second input audio signals.

In some embodiments, the audio amplifier includes a second push-pull amplifier output stage for receiving an inverted version of the first input audio signal and producing a second amplified audio signal, the second push-pull amplifier output stage being powered by the positive and negative power supply rails.

Additional aspects and embodiments of the inventions are identified and described in the following description of example embodiments.

BRIEF DESCRIPTION OF THE DRAWINGS

A preferred embodiment of the present invention will now be described in detail with reference to the drawings, in which.

DESCRIPTION OF EXEMPLARY EMBODIMENTS

Figure 1:
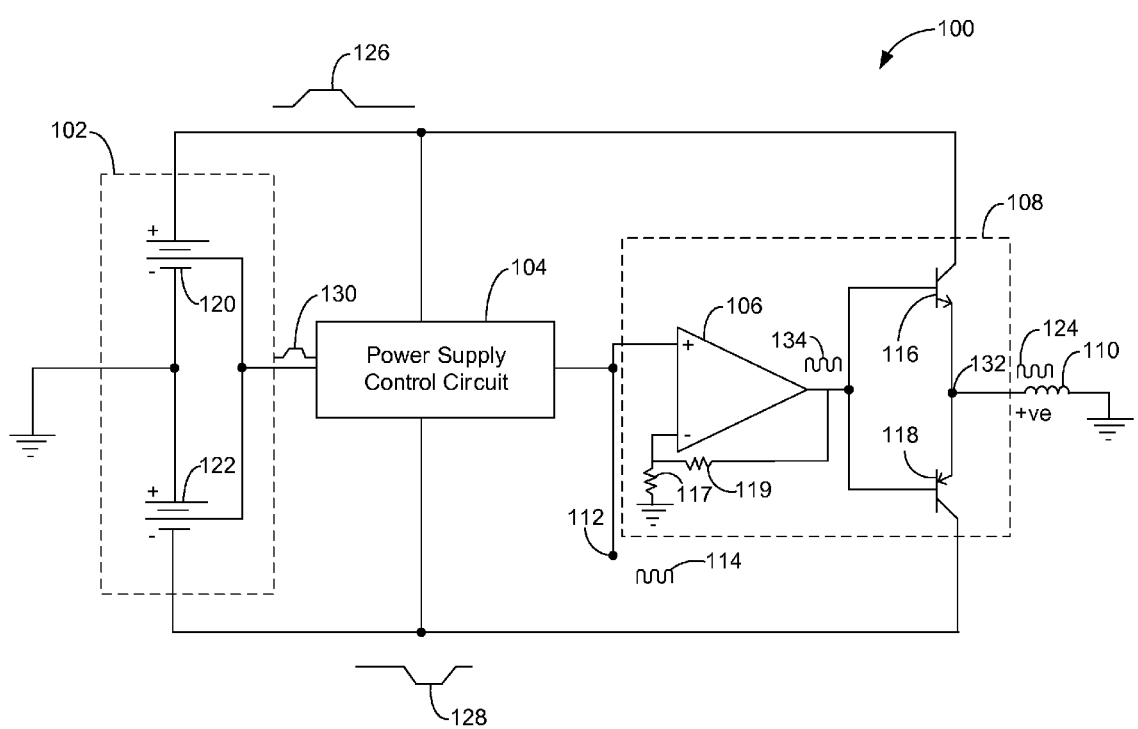
FIG. 1 is a circuit diagram of an audio amplifier in accordance with at least one embodiment.

Reference is first made to FIG. 1, in which an audio amplifier 100 in accordance with a first embodiment is illustrated. The audio amplifier 100 includes an audio input terminal 112, a push-pull amplifier output stage 108, a split power supply 102, and a power supply control circuit 104.

The audio input terminal 112 is typically coupled to an audio source (not shown) that provides an input audio signal 114. The input audio signal 114 may be a one volt peak-to-peak signal with a time varying magnitude and a time-varying frequency, or it may be any other type of analog audio signal.

The push-pull amplifier output stage 108 is coupled to the audio input terminal 112 to receive the input audio signal 114 and produces a corresponding amplified output audio signal 124 at an audio output terminal 132. A load 110, such as an audio speaker, is coupled to the audio output terminal 132 to receive the amplified output audio signal 124.

In amplifier 100, the push-pull amplifier output stage 108 is a linear class AB amplifier that includes an operational amplifier 106, first and second resistors 117 and 119, and a pair of complementary transistors 116 and 118. The operational amplifier 106 has an inverting input and a noninverting input, which are respectively indicated by the negative ("−") and positive ("+") signs. The inverting input is coupled to the output of the operational amplifier 106 and ground through a negative feedback network including the first and second resistors 117 and 119. The noninverting input is coupled to the audio input terminal 112 to receive the input audio signal 114. In this configuration, the operational amplifier 106 produces an operational amplifier output signal 134 that is a voltage-amplified version of the input audio signal 114. The voltage gain applied to the input audio signal 114 is equal to $1+R_{119}/R_{117}$, where $R_{117}$ is the resistance of the first resistor 117 and $R_{119}$ is the resistance of the second resistor 119. In this configuration the operational amplifier output signal 134 is proportional to the input audio signal 114. When the input audio signal 114 is positive, the operational amplifier output signal 134 is positive, and when the input audio signal 114 is negative, the operational amplifier output signal 134 is negative.

In this embodiment, the transistors 116 and 118 are npn and pnp bipolar junction transistors (BJTs), respectively, in common emitter configurations. The transistors 116 and 118 are also typically connected to a biasing network (not shown) to reduce the crossover distortion present in a strictly class B amplifier. This configuration is commonly known as a "class AB" amplifier. The transistors 116 and 118 are connected so that when the operational amplifier output signal 134 is positive, the first transistor 116 conducts and pushes current into the load 110; and when the operational amplifier output signal 134 is negative, the second transistor 118 conducts and pulls current from the load 110. A positive power supply rail 126 produced by the split power supply 102 powers the first transistor 116. A negative power supply rail 128 produced by the split power supply 102 powers the second transistor 118. The transistors 116 and 118 work together to produce the amplified output audio signal 124 which is a current amplified version of the operational amplifier output signal 134.

In operation, either the first transistor 116 or the second transistor 118 will require sufficient voltage from the corresponding power supply rail 126 or 128 to produce the amplified output audio signal 124. The specific voltage required will vary depending on the magnitude of the input audio signal 114. Any excess voltage supplied to the transistors 116 and 118 will cause power dissipation in the transistors 116 and 118 equal to the product of excess voltage and load current. Such dissipated power is lost and increases the power consumption of the push-pull amplifier output stage 108.

To address this issue, the power supply control circuit 104 and the split power supply 102 of FIG. 1 are configured to produce positive and negative power supply rails 126 and 128 that track the envelope or absolute value of the input audio signal 114, reducing the headroom between the power rails and the voltage required in push-pull amplifier output stage 108 to produce amplified output audio signal 124. The power supply control circuit 104 tracks the input audio signal 114 and produces a power supply control voltage 130 that produces positive and negative power supply rails 126 and 128 with the sufficient voltage to produce the amplified output audio signal 124.

The split power supply 102 includes two power sources 120 and 122. Each power source 120, 122 generates an output voltage that is based on a received control voltage. The first power source 120 generates the positive power supply rail 126, and the second power source 122 generates the negative power supply rail 128. In amplifier 100, both power sources are controlled by power supply control voltage 130 and are generated with corresponding magnitudes.

In addition to tracking the input audio signal 114, the power supply control circuit 104 is also configured to monitor the positive and negative power supply rails 126 and 128 and compensate for poor cross-regulation between the positive and negative power supply rails 126 and 128.

In the power supply control circuit 104 poor cross regulation is addressed by regulating the smaller (in absolute magnitude terms) of the positive power supply rail 126 and the negative power supply rail 128. By determining which of the two power supply rails 126 and 128 is smaller and regulating that, the split power supply 102 is able to produce enough voltage to allow the push-pull amplifier output stage 108 generate the amplified output audio signal 124.

Figure 2:
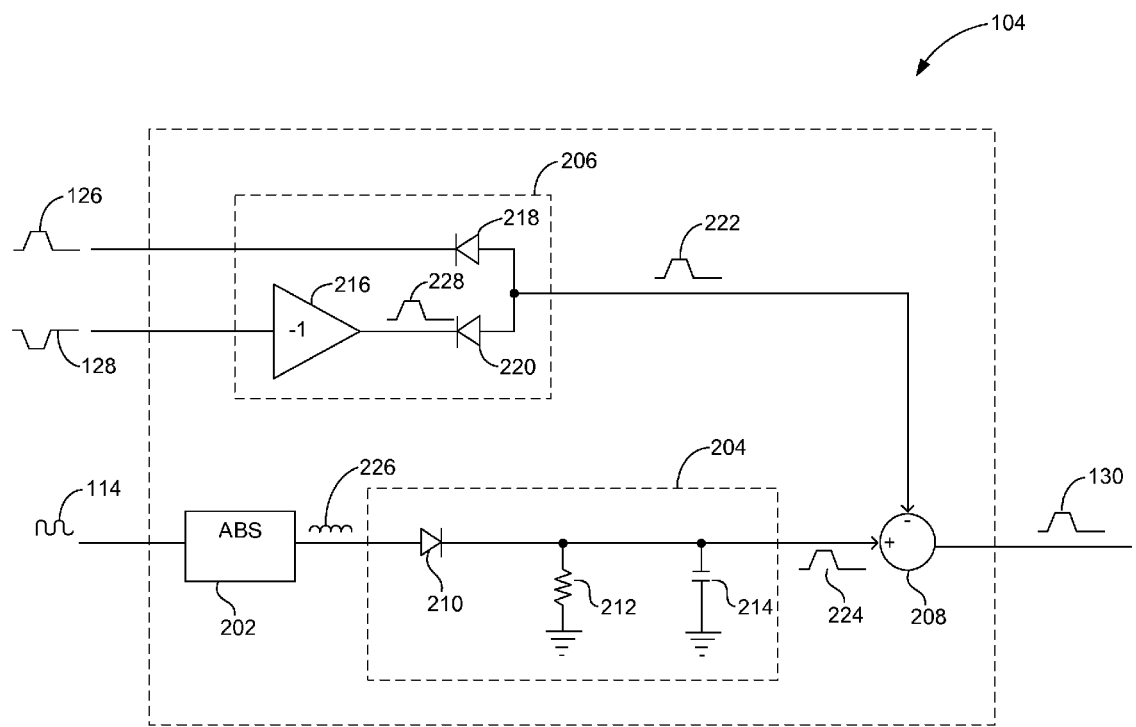
FIG. 2 is a circuit diagram of the power supply control circuit of FIG. 1 in accordance with at least one embodiment.

Reference is now made to FIG. 2, in which an exemplary embodiment of the power supply control circuit 104 of FIG. 1 is illustrated. The power supply control circuit 104 shown in FIG. 2 includes an absolute value block 202, an envelope detector 204, a comparator circuit 206 and a differential amplifier 208.

The absolute value block 202 receives the input audio signal 114 from the audio input terminal 112 and provides a corresponding rectified signal 226.

The envelope detector 204 takes the rectified signal 226 and produces an envelope signal 224, which is the envelope of the rectified signal 226. The envelope detector may include a diode 210, a resistor 212 and a capacitor 214. Capacitor 214 and resistor 212 are coupled in parallel between ground and the output of the absolute value block 202 through diode 210.

The rectified signal 226 is received by the diode 210 and once it exceeds the diode threshold it charges the capacitor 214 to a voltage of $V_{peak}$, which is equal to the peak of the rectified signal 226 less the diode drop. Once the rectified signal 226 drops below the diode threshold, the capacitor 214 discharges through the resistor 212.

The envelope detector 204 has a time constant $\tau$ equal to the product of $R_{212}$ and $C_{214}$ where $R_{212}$ is the resistance of the resistor 212 and $C_{214}$ is the capacitance of the capacitor 214. The time constant $\tau$ defines the rate at which the capacitor 214 discharges. In a class H amplifier with a linear class AB output stage, such as amplifier 100, it is preferable that the time constant $\tau$ be short so that the power supply rails 126 and 128 can closely track a falling input audio signal 114 thereby minimizing the conduction losses in the transistors 116 and 118. In some embodiments, the time constant $\tau$ is in the range of 1 ms to 100 μs. This allows the power supply rails 126 and 128 to closely track the input audio signal 114 in the 0 HZ to 1 kHz range.

Other amplifiers, such as class D amplifiers, do not typically need to track the input audio signal 114 so closely and thus do not require such a short time constant $\tau$. In a class D amplifier the output transistors are switching thus they will have an order of magnitude lower conduction loss as compared to a linear AB amplifier. As a result, the input audio signal 114 does not need to be so closely tracked to keep the efficiency high. All that is required in the class D amplifier is that the envelope is accurately tracked. Typically, tracking a 25 Hz signal is adequate for a class D amplifier. Accordingly, the time constant $\tau$ for a class D amplifier may typically be 10 ms or longer.

The comparator circuit 206 receives the positive and negative power supply rails 126 and 128 and outputs a power supply rail 222 that represents the smaller of the positive and negative power supply rails 126 and 128. The comparator circuit 206 may include an inverter 216 and two diodes 218 and 220. The inverter 216 receives the negative supply rail 128 and produces an inverted negative supply rail 228. The diodes 218 and 220 then work together to select the smaller of the positive power supply rail 126 and the inverted negative supply rail 228, and output the smaller power supply rail as power supply rail 222.

The differential amplifier 208 receives the envelope signal 224 and the power supply rail 222 and outputs the power supply control voltage signal 130 as an error signal corresponding to the difference between the envelope signal 224 and the power supply rail 222.

Figure 3:
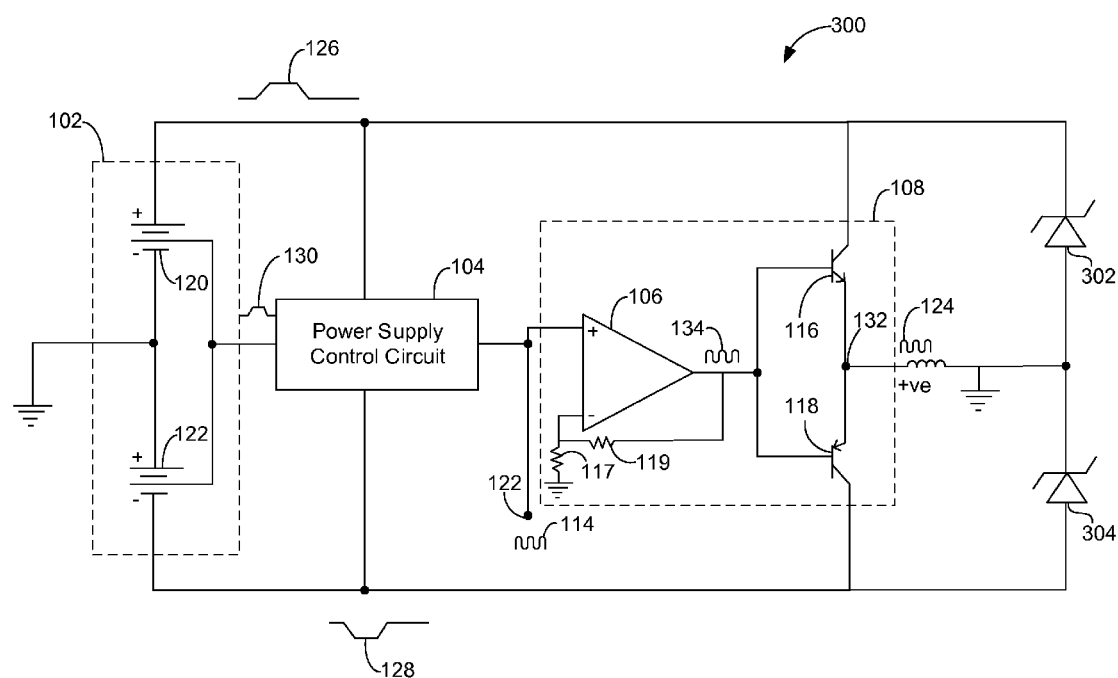
FIG. 3 is a circuit diagram of an audio amplifier in accordance with at least one embodiment.

Reference is now made to FIG. 3, in which an audio amplifier 300 in accordance with a second embodiment is illustrated. Audio amplifier 300 is a variation of audio amplifier 100. The difference between audio amplifier 300 and audio amplifier 100 is the addition of two voltage clamping devices 302 and 304. The two voltage clamping devices 302 and 304 ensure that the positive and negative power supply rails 126 and 128 do not exceed a predetermined threshold voltage. This prevents an overvoltage condition on the transistors 116 and 118 which may occur due to imperfections in the unloaded side of the split power supply 102 causing its output voltage to raise too high.

The first voltage clamping device 302 is connected between the positive power supply rail 126 and ground. The first voltage clamping device 302 ensures that the positive power supply rail 126 does not exceed a predetermined threshold voltage. When the positive power supply rail 126 exceeds the predetermined threshold voltage, the first voltage clamping devices 302 dissipates the excess charge and prevents the positive power supply rail 126 from climbing further.

Similarly, the second voltage clamping device 304 is connected between the negative power supply rail 128 and ground. The second voltage clamping device 304 ensures that the negative power supply rail 128 does not drop below a predetermined threshold voltage. When the negative power supply rail 128 drops below the predetermine threshold voltage, the second voltage clamping device 304 dissipates the excess charge and prevents the negative power supply rail 128 from dropping further.

In some embodiments, such as the embodiment shown in FIG. 3, the voltage clamping devices 302 and 304 are zener diodes. In other embodiments, the voltage clamping devices 302 and 304 may be any other circuits that provide the functionality described above.

Figure 4:
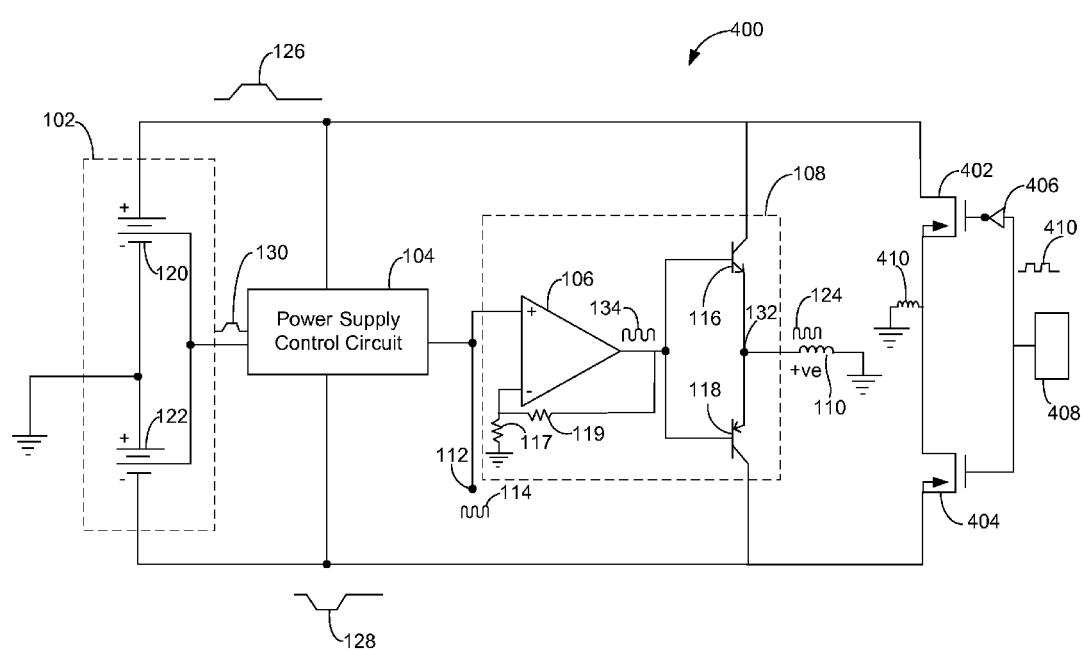
FIG. 4 is a circuit diagram of an audio amplifier in accordance with at least one embodiment.

Reference is now made to FIG. 4, in which an audio amplifier 400 in accordance with a third embodiment is illustrated. Audio amplifier 400 is a variation of audio amplifier 100. The difference between audio amplifier 400 and audio amplifier 100 is the addition of two switching transistors 402 and 404, an inverter 406, a 50% duty cycle oscillator 408 and an inductor 410. This active switching technology acts as a voltage balancer between the positive and negative power supply rails 126 and 128. The excess charge from the unloaded power supply rail is moved or shifted to the loaded power supply rail such that the voltages on the power supply rails 126 and 128 have approximately equal magnitude. This is an improvement over audio amplifier 300 in that instead of dissipating or losing the excess charge it is redistributed.

In this embodiment, the active switching technology operates as follows. The 50% duty cycle oscillator 408 generates a pulse signal 412. When the pulse signal 412 is high it will enable the second switching transistor 404, and when the pulse signal 412 is low it will be inverted by the inverter 406 to enable the first switching transistor 402. In this manner the switching transistors 402 and 404 are enabled in an alternating fashion with each having 50% on-time and 50% off-time. This causes any voltage imbalance between the positive and negative power supply rails 126 and 128 to appear as an average voltage across the inductor 410. As a result, the low frequency average current in inductor 410 ramps up or down and naturally moves charge through the switching transistors 402 and 404 from the higher voltage power supply rail to the lower voltage power supply rail until they are approximately equal voltage again, at which point the average inductor current ramps down to zero.

Figure 5:
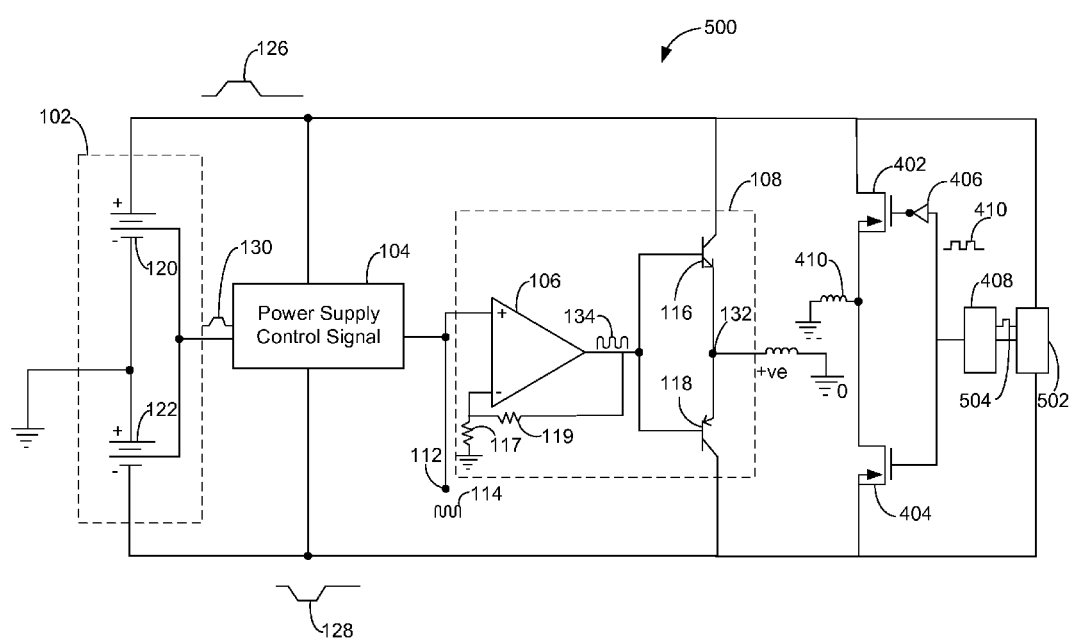
FIG. 5 is a circuit diagram of an audio amplifier in accordance with at least one embodiment.

Reference is now made to FIG. 5, in which an audio amplifier 500 in accordance with a fourth embodiment is illustrated. Audio amplifier 500 is a variation of audio amplifier 400. The difference between audio amplifier 500 and audio amplifier 400 is the addition of an imbalance detector 502. The imbalance detector 502 receives as inputs the positive and negative power supply rails 126 and 128 and outputs a control signal 504 which activates or deactivates the 50% duty cycle oscillator 408. In one embodiment, the imbalance detector 502 only activates the 50% duty cycle oscillator 408 when a sufficient imbalance or an overvoltage condition is detected. The remaining time, the 50% duty cycle oscillator 408 is disabled and thus both switching transistors 402 and 404 are off.

Figure 6:
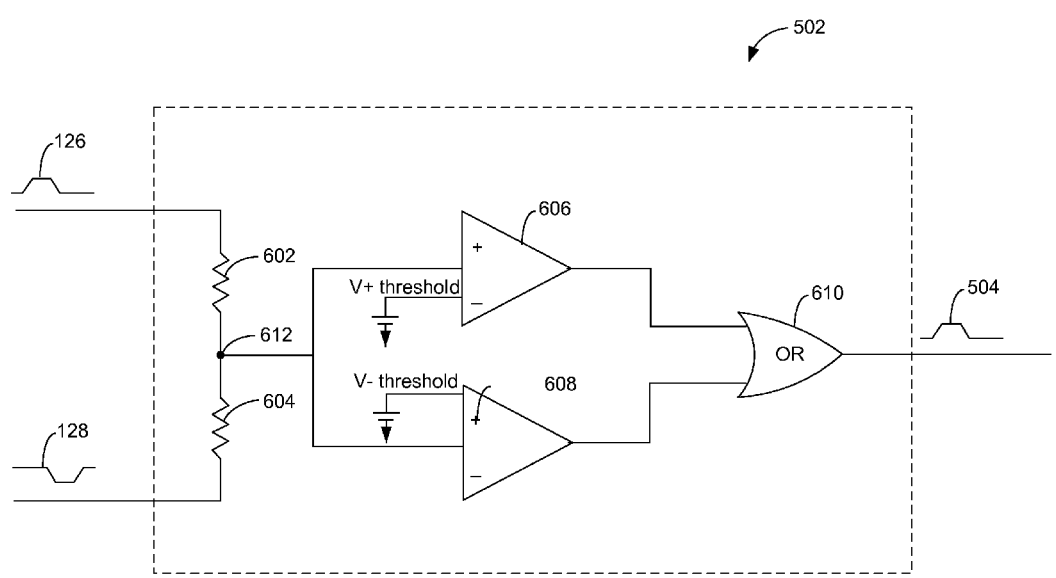
FIG. 6 is a circuit diagram of the imbalance detector of FIG. 5 in accordance with at least one embodiment.

Reference is now made to FIG. 6, in which an exemplary embodiment of the imbalance detector 502 of FIG. 5 is illustrated. The imbalance detector 502 includes a first resistor 602, a second resistor 604, a first comparator 606, a second comparator 608 and an OR gate 610. The first and second resistors 602 and 604 are connected in series between the positive and negative power supply rails 126 and 128. In one embodiment the first and second resistors 602 and 604 have the same resistance such that the voltage at node 612 is half of the difference between the positive power supply rail 126 and the magnitude of the negative voltage supply rail 128.

Each comparator 606 and 608 has inverting and noninverting inputs respectively indicated by the negative ("−") and positive ("+") signs. A positive threshold voltage $V^+_{threshold}$ is input to the inverting terminal of the first comparator. A negative threshold voltage $V^-_{threshold}$ is input to the noninverting terminal of the second comparator 608. The node 612 is coupled to the noninverting terminal of the first comparator 606 and the inverting terminal of the second comparator 608.

When the voltage at node 612 is above the positive threshold $V^+_{threshold}$ the output of the first comparator 606 will be logic high. When the voltage at node 612 is below the positive threshold $V^+_{threshold}$, the output of the first comparator 606 will be logic low. Similarly when the voltage at node 612 is below the negative threshold $V^-_{threshold}$ the output of the second comparator 608 will be logic high. When the voltage at node 612 is above the negative threshold $V^-_{threshold}$, the output of the second comparator 608 will be logic low.

When either of the comparator 606 and 608 outputs is high, the output of the OR gate 610 will be logic high. Only when both of the comparator 606 and 608 outputs are logic low is the output of the OR gate 610 logic low. Therefore the OR gate output will be high when voltage at node 612 is greater than the positive threshold $V^+_{threshold}$ or less than the negative threshold $V^-_{threshold}$.

Figure 7:
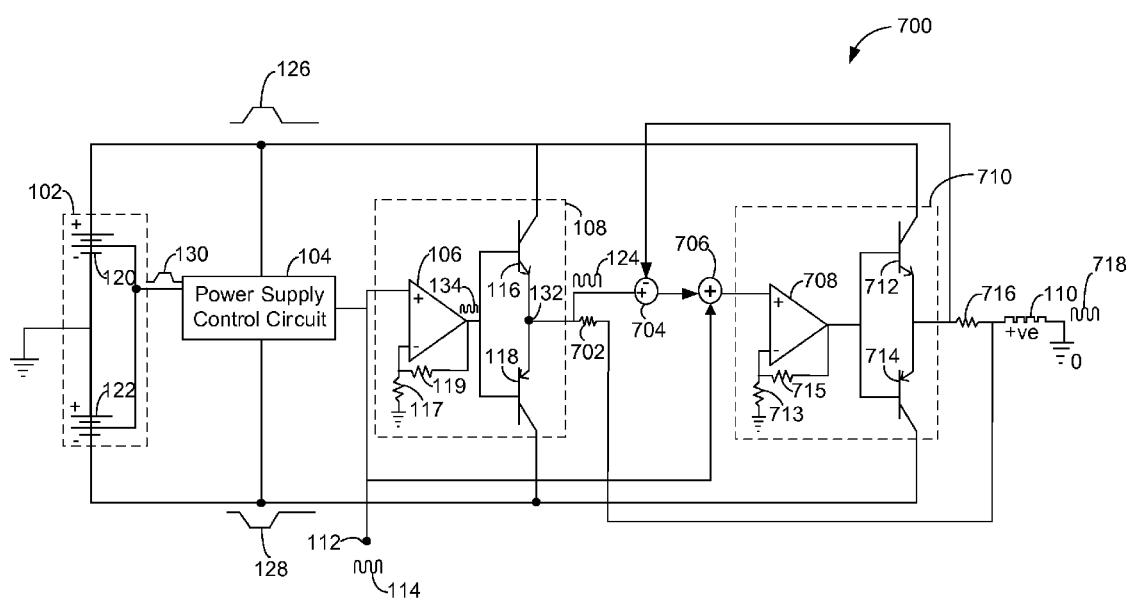
FIG. 7 is a circuit diagram of an audio amplifier in accordance with at least one embodiment.

Reference is now made to FIG. 7, in which an audio amplifier 700 in accordance with a fifth embodiment is illustrated. Audio amplifier 700 is a variation of audio amplifier 100. The difference between audio amplifier 700 and audio amplifier 100 is the addition of a second push-pull amplifier stage 710 paralleled with the first push-pull amplifier stage 108. The second push-pull amplifier stage 710 includes an operational amplifier 708, third and fourth resistors 713 and 715, and complementary transistors 712 and 714. The second push-pull amplifier stage 710 is indirectly coupled to the audio output terminal 132 to receive a version of the amplified output audio signal 124 and produces an second amplified output audio signal 718.

Typically, push-pull amplifier output stages are provided on a single integrated circuit (IC) chip. In some embodiments, it may be desirable to parallel several IC chips to obtain the desired output current. For example, paralleling two push-pull amplifier output stages doubles the output current supplied to the load 110. Since each push-pull amplifier stage will have small gain mismatches due to manufacturing tolerances, sharing resistors 702 and 716 and feedback loops (comprising differential amplifier 704 and summer 706) are used to ensure that the two push-pull amplifier stages 108 and 710 will have approximately equal output current. This method of paralleling integrated circuits is well known and will not be further described.

Figure 8:
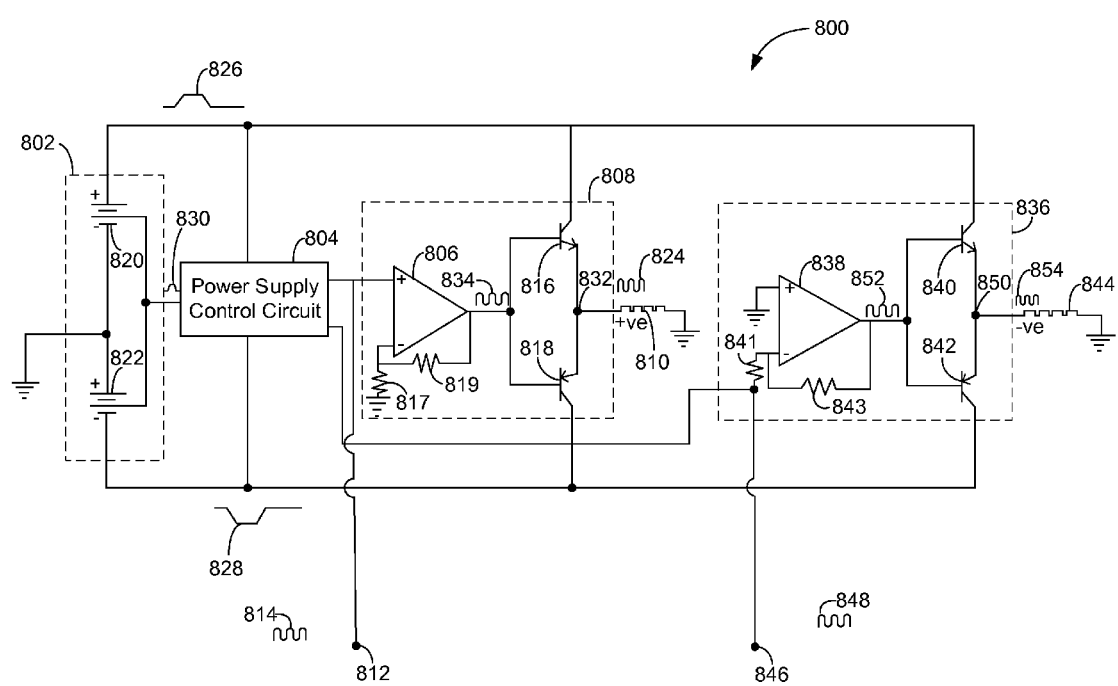
FIG. 8 is a circuit diagram of an audio amplifier in accordance with at least one embodiment.

Reference is now made to FIG. 8, in which an audio amplifier 800 according to a sixth embodiment is illustrated. Elements of audio amplifier 800 that correspond to audio amplifiers 100, 300, 400, 500 and 700 are identified by similar reference numerals. Audio amplifier 800 includes two audio input terminals 812 and 846, a split power supply 802, a power supply control circuit 804, a first push-pull amplifier output stage 808, and a second push-pull amplifier output stage 836.

A first input audio signal 814 is received at the first audio input terminal 812 and a second input audio signal 848 is received at the second audio input terminal 846. Typically, although not necessarily, the first and second input audio signals 814 and 848 will be related. For example, they may be the left and right audio signals of a stereo audio signal, or two channels in a multi-channel surround sound audio signal.

The first push-pull amplifier output stage 808 is coupled to the first audio input terminal 812 to receive the first input audio signal 814 and produces a corresponding first amplified output audio signal 824 at a first output audio terminal 832. A first load 810, such as an audio speaker, is coupled to the first output audio terminal 832 to receive the first amplified output audio signal 824.

In amplifier 800, the first push-pull amplifier output stage 808 is a linear class AB amplifier that includes a first operational amplifier 806, first and second resistors 817 and 819, and a pair of complementary transistors 816 and 818. The first operational amplifier 806 has an inverting input and a noninverting input, respectively, indicated by negative ("−") and positive ("+") signs. The inverting input is coupled to the output of the first operational amplifier 806 and to ground through a negative feedback network including first and second resistors 817 and 819. The noninverting input is coupled to the first audio input terminal 812 to receive the first input audio signal 814. In this configuration, the first operational amplifier 806 produces a first operational amplifier output signal 834 that is a voltage-amplified version of the first input audio signal 814. The voltage gain applied to the first input audio signal 814 is equal to $1+R_{819}/R_{817}$, where $R_{817}$ is the resistance of the first resistor 817 and $R_{819}$ is the resistance of the second resistor 819. In this configuration the first operational amplifier output signal 834 is proportional to the first input audio signal 814. When the first input audio signal 814 is positive, the first operational amplifier output signal 834 is positive, and when the first input audio signal 814 is negative, the first operational amplifier output signal 834 is negative.

Typically the transistors 816 and 818 of the first push-pull amplifier output stage 808 are npn and pnp bipolar junction transistors (BJTs), respectively, in common emitter configurations. The transistors 816 and 818 are also typically connected to a biasing network (not shown) to reduce the crossover distortion present in a strictly class B amplifier. The transistors 816 and 818 are connected so that when the first operational amplifier output signal 834 is positive, the first transistor 816 conducts and pushes current into the first load 810; and when the first operational amplifier output signal 834 is negative, the second transistor 818 conducts and pulls current from the first load 810. The first transistor 816 is powered by a positive power supply rail 826 produced by the split power supply 802. The second transistor 818 is powered by a negative power supply rail 828 produced by the split power supply 802. The transistors 816 and 818 work together to produce the first amplified output audio signal 824 that is a current amplified version of the first operational amplifier output signal 834.

The second push-pull amplifier output stage 836 is coupled to the second audio input terminal 846 to receive the second input audio signal 848 and produces a corresponding second amplified output audio signal 854 at a second audio output terminal 850. A second load 844, such as an audio speaker, is coupled to the second audio output terminal 850 to receive the second amplified output audio signal 854.

In amplifier 800, the second push-pull amplifier output stage 836 is a linear class AB amplifier that includes a second operational amplifier 838, third and fourth resistors 841 and 843, and a pair of complementary transistors 840 and 842. The second operational amplifier 838 has an inverting input and a noninverting input, respectively, indicated by the negative ("−") and positive ("+") signs. The noninverting input is coupled to ground. The inverting input is coupled to the second audio input terminal 846 and the output of the second operational amplifier 838 through a negative feedback network including third and fourth resistors 841 and 843, to receive and amplify the second input audio signal 848. In this configuration the second operational amplifier 838 produces a second operational amplifier output signal 852 that is a voltage-amplified version of the second input audio signal 848. The voltage gain applied to the second input audio signal 848 is equal to $-R_{843}/R_{841}$ where $R_{841}$ is the resistance of the third resistor 841 and $R_{843}$ is the resistance of the fourth resistor 843. Thus, the second operational amplifier 838 not only amplifies the second input audio signal 848, but it also inverts it. Accordingly, the second operational amplifier output signal 852 has an inverse relationship the second input audio signal 848. When the second input audio signal 848 is positive, the second operational amplifier output signal 852 is negative, and when the second input audio signal 848 is negative, the second operational amplifier output signal 852 is positive.

Typically the transistors 840 and 842 of the second push-pull amplifier output stage 836 are npn and pnp bipolar junction transistors (BJTs), respectively, in common emitter configurations. The transistors 840 and 842 are also typically connected to a biasing network (not shown) to reduce the crossover distortion present in a strictly class B amplifier. The transistors 840 and 842 are connected so that when the second operational amplifier output signal 852 is positive, the first transistor 840 conducts and pushes current into the second load 844; and when the second operational amplifier output signal 852 is negative, the second transistor 842 conducts and pulls current from the load 844. The first transistor 840 is powered by the positive power supply rail 826 produced by the split power supply 802. The second transistor 842 is powered by the negative power supply rail 828 produced by the split power supply 802. The transistors 840 and 842 work together to produce the second amplified output audio signal 854 that is a current amplified version of the second operational amplifier output signal 852.

The second load 844 is coupled to the second audio output terminal 850 in an inverted manner. Since the second amplified output audio signal 854 is an inverted version of the second input audio signal 848, the corresponding load 844 must be inverted so that the sound coming from second load 844 is reproduced with the correct polarity. Typically, inverting the load 844 involves swapping the leads of the load 844.

Most music in stereo format contains somewhat equal low frequency (bass) information on left and right channels (e.g. the first and second input audio signals 814 and 848). Therefore, by having one of the channels (e.g. the first input audio signal 814) drive the first pair of transistors 816 and 818, and having an inverted version of the second channel (e.g. second input audio signal 848) drive the second pair of transistors 840 and 842, a generally balanced low frequency load will be supplied to the split power supply 802.

High frequency imbalance may be handled in a different manner. Capacitors (not shown) may be placed within the first push-pull amplifier output stage 808 between the positive power supply rail 826 to ground, and between ground and the negative power supply rail 828. These capacitors naturally source and sink the higher frequency charge required by high frequency unbalanced amplifier loads, thereby smoothing the power drawn from the split power supply 802 and hence balancing its "effective load" comprised of the capacitors in parallel with the first and second push-pull amplifier output stages 808 and 836.

The power supply control circuit 804 and the split power supply 802 of FIG. 8 are configured to produce positive and negative power supply rails 826 and 828 that track the envelope or absolute value of the greater of the first and second input audio signals 814 and 848. Since the positive and negative power supply rails 826 and 828 drive both the first and second push-pull amplifier output stages 808 and 836, the positive and negative power supply rails 826 and 828 must track the greater of the first and second input audio signals 814 and 848 to provide enough voltage to produce both the first and second amplified output audio signals 824 and 854. If the positive and negative power supply rails 826 and 828 only tracked one of the input audio signals 814 or 848 then when the untracked input audio signal exceeded the tracked input audio signal then there would not be enough voltage to adequately amplify the untracked input audio signal.

The power supply control circuit 804 tracks the greater of the first and second input audio signal 814 and 848 and produces a power supply control voltage 830 that will produce positive and negative power supply rails 826 and 828 with the specific amount of voltage required to produce the greater of the first and second amplified output audio signals 824 or 854.

The split power supply 802 includes two power sources 820 and 822. Both power sources 820 and 822 generate an output voltage that is based on a received control voltage. The first power source 820 generates the positive power supply rail 826, and the second power source 822 generates the negative power supply rail 828. In amplifier 800, both power sources 820 and 822 are controlled by a single control voltage, namely the power supply control voltage 830 generated by the power supply control circuit 804. This means that the two power sources 820 and 822 are tied to each other.

In addition to tracking the greater of the first and second input audio signals 814 and 848, the power supply control circuit 804 is also configured to monitor the positive and negative power supply rails 826 and 828 and compensate for poor cross-regulation between the positive and negative power supply rails 826 and 828. As described above in reference to FIG. 1, split power supplies, such as split power supply 802, typically have poor cross regulation when the power sources 820 and 822 are not equally loaded. For example, if the first power source 820 is heavily loaded, and the second power source 822 is lightly loaded then the power sources 820 and 822 will not produce positive and negative power supply rails 826 and 828 of the same magnitude. This is typically the result of imperfect coupling of the transformer windings, stray inductance in the transformer, winding resistance etc.

The power supply control circuit 804 of FIG. 8 compensates for poor cross regulation by regulating the minimum of the positive power supply rail 826 and the absolute value of the negative power supply rail 828. By determining which of the two power supply rails 826 and 828 is smaller and regulating that, the split power supply 802 will always be able to produce enough voltage to generate the required output audio signals.

In some embodiments the first and second loads 810 and 844 are in separate speakers (for example, separate speaker units) and in other embodiments the first and second loads 810 and 844 are separate drivers in the same speaker unit.

Figure 9:
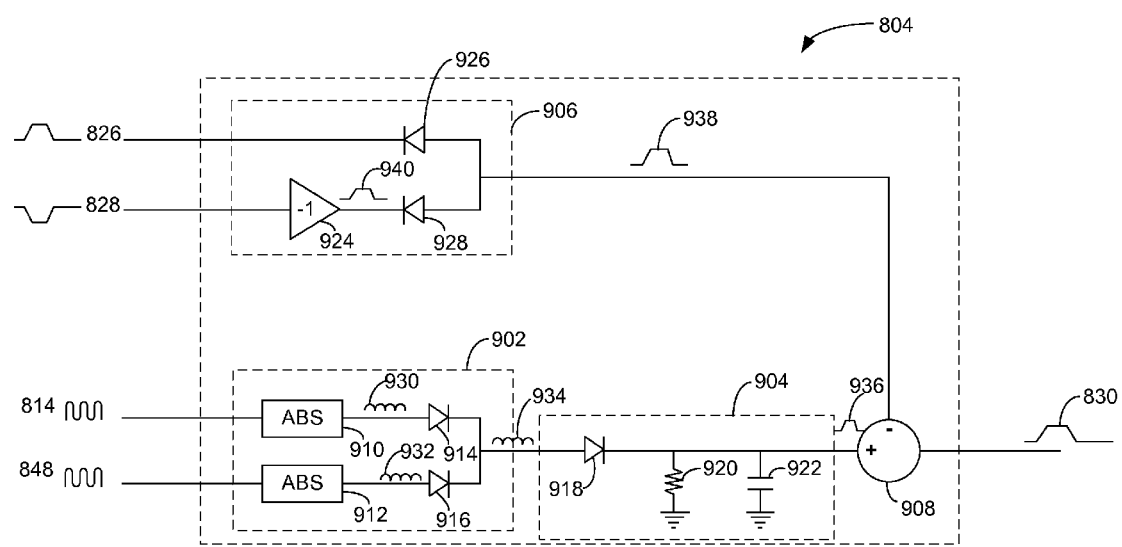
FIG. 9 is a circuit diagram of the power supply control circuit of FIG. 8 in accordance with at least one embodiment.

Reference is now made to FIG. 9, in which an exemplary embodiment of the power supply control circuit 804 of FIG. 8 is illustrated. The power supply control circuit 804 shown in FIG. 9 includes a first comparator circuit 902, an envelope detector 904, a second comparator circuit 906 and a differential amplifier 908.

The first comparator circuit 902 receives as inputs the first and second input audio signals 814 and 848 and outputs the larger of the absolute value of the two signals as rectified signal 934. The first comparator circuit 902 may include a first absolute value block 910, a second absolute value block 912, a first diode 914 and a second diode 916. The first absolute value block 910 receives the first input audio signal 814 from the first audio input terminal 812 and produces a corresponding rectified signal 930. The second absolute value block 912 receives the second input audio signal 848 from the second audio input terminal 846 and produces a corresponding rectified signal 932. The diodes 914 and 916 then work together to select the larger of the two rectified signals 930 and 932 and output the larger signal as rectified signal 934.

The envelope detector 904 takes the rectified signal 934 and produces an envelope signal 936, which is the envelope of the rectified signal 934. The envelope detector 904 may include a diode 918, a resistor 920 and a capacitor 922. Capacitor 922 and resistor 920 are coupled in parallel between ground and the output of the first comparator circuit 902 through diode 918.

The larger rectified signal 934 is received by the diode 918 and once it exceeds the diode threshold it charges the capacitor 922 to a voltage of $V_{peak}$, which is equal to the peak of the rectified signal 934 less a diode drop. Once the rectified signal 934 drops below the diode threshold, the capacitor 922 discharges through the resistor 920.

In other embodiments, diode 918 can be removed and replaced with a shorting wire, and the combined functionality of the first comparator circuit 902 and the envelope detector 904 will be unchanged except there will no longer be an additional voltage drop due to diode 918.

The envelope detector 904 has a time constant τ equal to the product of $R_{920}$ and $C_{922}$ where $R_{920}$ is the resistance of the resistor 920 and $C_{922}$ is the capacitance of the capacitor 922. The time constant τ defines the rate at which the capacitor 922 discharges. In a class H amplifier with a linear class AB output stage, such as amplifier 800, it is preferred that the time constant τ be short so that the power supply rails 826 and 828 can closely track a falling input audio signal 814 or 848 thereby minimizing the conduction losses in the transistors 816, 818, 840, and 842. In some embodiments, the time constant τ is in the range of 1 ms to 100 µs. This allows the power supply rails 826 and 828 to closely track an input audio signal 814 or 848 in the 0 HZ to 1 kHz range.

Other amplifiers, such as class D amplifiers, do not typically need to track the input audio signal 814 or 848 so closely and thus do not require such a short time constant τ. In a class D amplifier the output transistors are switching thus they will have an order of magnitude lower conduction loss as compared to a linear AB amplifier. As a result, the input audio signal 814 or 848 does not need to be so closely tracked to keep the efficiency high. All that is required in the class D amplifier is that the envelope is accurately tracked. Typically, tracking a 25 Hz signal is adequate for a class D amplifier. Accordingly, the time constant τ for a class D amplifier is typically 10 ms or longer.

The second comparator circuit 906 receives the positive and negative power supply rails 826 and 828 and outputs a power supply rail 938 that represents the smaller of the positive and negative power supply rails 826 and 828. The comparator circuit 906 may include an inverter 924 and two diodes 926 and 928. The inverter 924 receives the negative power supply rail 828 and produces an inverted negative supply rail 940. The diodes 926 and 928 then work together to select the smaller of the positive power supply rail 826 and the inverted negative supply rail 940, and output the smaller power supply rail as power supply rail 938.

The differential amplifier 908 receives the envelope signal 936 and the power supply rail 938 and outputs a power supply control voltage 830 corresponding to the difference between the envelope signal 936 and the power supply rail 938.

Figure 10:
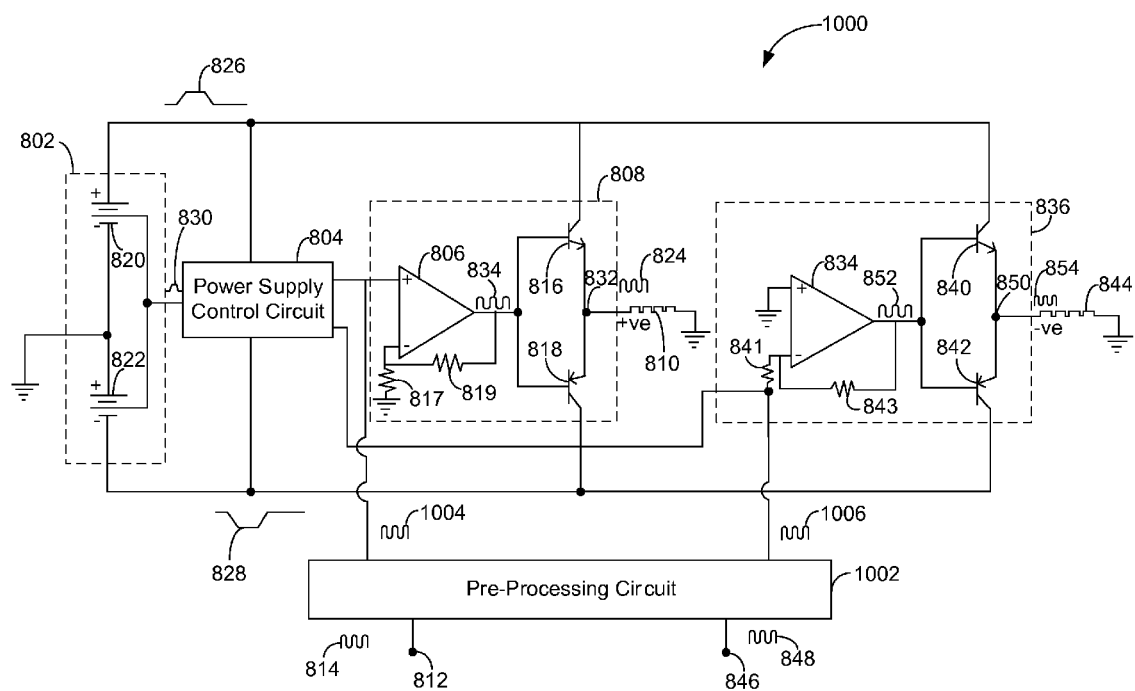
FIG. 10 is a circuit diagram of an audio amplifier in accordance with at least one embodiment.

Reference is now made to FIG. 10, in which an audio amplifier 1000 in accordance with a seventh embodiment is illustrated. Audio amplifier 1000 is a variation of audio amplifier 800. The difference between audio amplifier 1000 and audio amplifier 800 is the addition of a pre-processing circuit 1002. The pre-processing circuit 1002 is situated between the audio input terminals 812 and 846 and the remainder of the circuit. The pre-processing circuit 1002 receives the first and second input audio signals 814 and 848, processes them, and outputs first and second modified input audio signals 1004 and 1006. The first and second modified input audio signals 1004 and 1006 are then sent to the remainder of the circuit where they are treated as the first and second input audio signals.

In one embodiment, the processing involves filtering the first and second input audio signals 814 and 848 into corresponding high frequency and low frequency components, then adding the low frequency components of both input signals to each high frequency component to produce modified input audio signals 1004 and 1006. These modified input audio signals 1004 and 1006 will have different high frequency components, but the same low frequency component. Because the two modified input audio signals 1004 and 1006 have equal low frequency components they will provide a balanced low frequency load to the split power supply 802.

There are several reasons why the low frequency information has more effect on the load balancing that the high frequency component. First, high frequency audio signals are usually lower power so the high frequencies don't typically provide as much load imbalance as the low frequencies. Second, the high frequencies can be so high that output capacitors (not shown) may be placed within each push-pull amplifier output stage 808 and 836, between the power supply rails 826 and 828 and ground, to filter or "smooth" the high frequency power consumption so that the split power supply 802 sees a substantially balanced load.

The capacitors are an energy reservoir (or filter) that, when placed on the power supply rails 826 and 828, naturally give and receive energy to/from the power supply rails 826 and 828 as needed. The higher the frequency of the load, the larger the percentage of the load's required pulsed energy (charge*voltage) that can be sourced/sunk from these capacitors before their voltage collapses. Accordingly, if the load frequency is high enough, the split power supply 802 will supply only the average power and the capacitors will supply all the high frequency pulsed power.

The summing of the low frequency audio signals can be done since human hearing typically can't accurately identify where the low frequency sounds are coming from. Accordingly, it does not typically matter to a human listener if the low frequency sounds are coming out of the left or right speaker, or both, for example.

Figure 11:
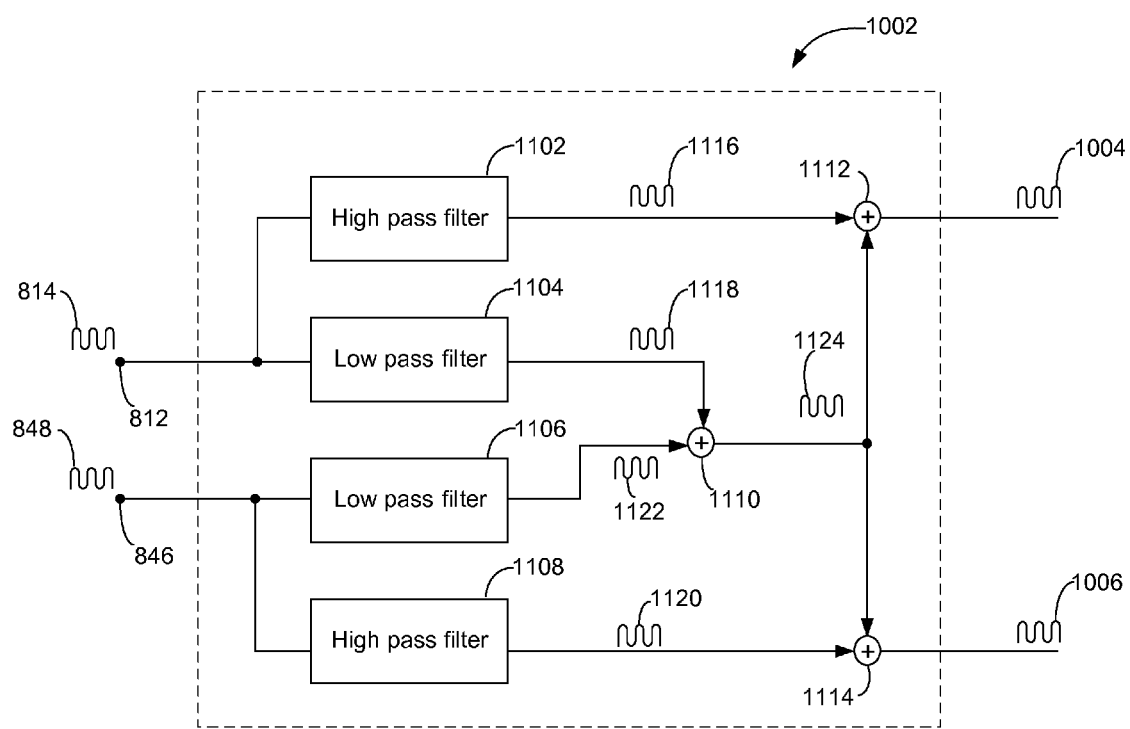
FIG. 11 is a circuit diagram of the pre-processing circuit of FIG. 10 in accordance with at least one embodiment.

Reference is now made to FIG. 11, in which an exemplary embodiment of the pre-processing circuit 1002 of FIG. 10 is illustrated. The pre-processing circuit 1002 of FIG. 11 includes a first high pass filter 1102, a first low pass filter 1104, a second low pass filter 1106, a second high pass filter 1108, a first summer 1110, a second summer 1112 and a third summer 1114.

The first high pass filter 1102 and the first low pass filter 1104 are coupled to the first audio input terminal 812 to receive the first input audio signal 814. The first high pass filter 1102 filters out the low frequencies of the first input audio signal 814 and produces a first high frequency signal 1116 that only contains frequencies above a preconfigured cut-off frequency. In some embodiments the cut-off frequency of the first high pass filter 1102 is 250 Hz. Conversely, the first low pass filter 1104 filters out the high frequencies of the first input audio signal 814 and produces a first low frequency signal 1118 that only contains frequencies below a preconfigured cut-off frequency.

The second high pass filter 1108 and the second low pass filter 1106 are coupled to the second audio input terminal 846 to receive the second input audio signal 848. The second high pass filter 1108 filters out the low frequencies of the second input audio signal 848 and produces a second high frequency signal 1120 that only contains frequencies above a preconfigured cut-off frequency. In some embodiments the cut-off frequency of the second high pass filter 1108 is 250 Hz. Conversely, the second low pass filter 1106 filters out the high frequencies of the second input audio signal 848 and produces a second low frequency signal 1122 that only contains frequencies below a preconfigured cut-off frequency.

The first summer 1110 receives the first and second low frequency signals 1118 and 1122 and adds them together to produce a total low frequency signal 1124. The second summer 1112 receives the first high frequency signal 1116 and the total low frequency signal 1124 and adds them together to produce the first modified input audio signal 1004. The third summer 1114 receives the second high frequency signal 1120 and the total low frequency signal 1124 and adds them together to produce the second modified input signal 1006. The result is that the first and second modified input audio signals 1004 and 1006 will have the same low frequency components, but different high frequency components.

Figure 12:
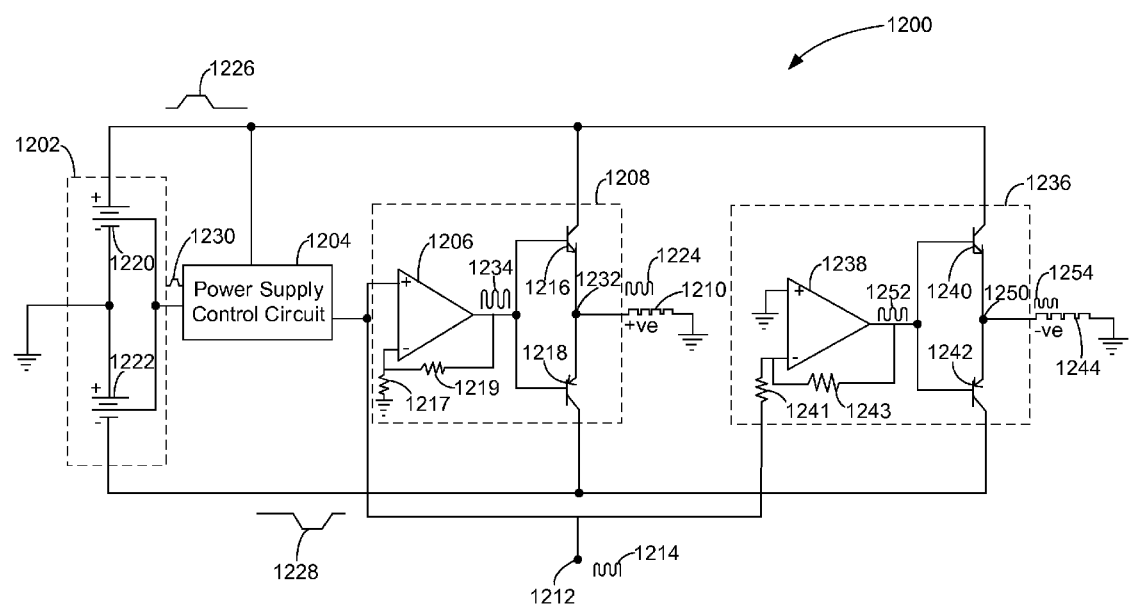
FIG. 12 is a circuit diagram of an audio amplifier in accordance with at least one embodiment.

Reference is now made to FIG. 12, in which an audio amplifier 1200 in accordance with an eighth embodiment is illustrated. Elements of audio amplifier 1200 that correspond to audio amplifiers 100, 300, 400, 500, 800 and 1000 are identified by similar reference numerals. Audio amplifier 1200 includes an audio input terminal 1212, a split power supply 1202, a power supply control circuit 1204, a first push-pull amplifier output stage 1208, and a second push-pull amplifier output stage 1236.

An input audio signal 1214 is received at the audio input terminal 1212. The first push-pull amplifier output stage 1208 is coupled to the audio input terminal 1212 to receive the input audio signal 1214 and produces a corresponding first amplified output audio signal 1224 at a first audio output terminal 1232. A first load 1210, such as an audio speaker, is coupled to the first audio output terminal 1232 to receive the first amplified output audio signal 1224.

In amplifier 1200, the first push-pull amplifier output stage 1208 is a linear class AB amplifier that includes a first operational amplifier 1206, first and second resistors 1217 and 1219, and a pair of complementary transistors 1216 and 1218. The first operational amplifier 1206 has inverting and noninverting inputs respectively indicated by the negative ("−") and positive ("+") signs. The inverting input is coupled to ground and to the first operational amplifier 1206 output through a negative feedback network including the first and second resistors 1217 and 1219. The noninverting input is coupled to the audio input terminal 1212 to receive the input audio signal 1214. In this configuration, the first operational amplifier 1206 produces a first operational amplifier output signal 1234 that is a voltage-amplified version of the first input audio signal 1214. The voltage gain applied to the first input audio signal 1214 is equal to $1+R_{1219}/R_{1217}$ where $R_{1217}$ is the resistance of the first resistor 1217 and $R_{1219}$ is the resistance of the second resistor 1219. In this configuration the first operational amplifier output signal 1234 is proportional to the input audio signal 1214. When the input audio signal 1214 is positive, the first operational amplifier output signal 1234 is positive, and when the input audio signal 1214 is negative, the first operational amplifier output signal 1234 is negative.

Typically the transistors 1216 and 1218 of the first push-pull amplifier output stage 1208 are npn and pnp bipolar junction transistors (BJTs), respectively, in common emitter configurations. The transistors 1216 and 1218 are also typically connected to a biasing network (not shown) to reduce the crossover distortion present in a strictly class B amplifier. The transistors 1216 and 1218 are connected so that when the first operational amplifier output signal 1234 is positive, the first transistor 1216 conducts and pushes current into the first load 1210. When the first operational amplifier output signal 1234 is negative, the second transistor 1218 conducts and pulls current from the first load 1210. The first transistor 1216 is powered by a positive power supply rail 1226 produced by the split power supply 1202. The second transistor 1218 is powered by a negative power supply rail 1228 produced by the split power supply 1202. The transistors 1216 and 1218 work together to produce the first amplified output audio signal 1224 that is a current amplified version of the first operational amplifier output signal 134.

The second push-pull amplifier output stage 1236 is also coupled to the audio input terminal 1212 to receive the input audio signal 1214 and produces a corresponding second amplified output audio signal 1254 at a second audio output terminal 1250. A second load 1244, such as an audio speaker, is coupled to the second audio output terminal 1250 to receive the second amplified output audio signal 1254.

In amplifier 1200, the second push-pull amplifier output stage 1236 is a linear class AB amplifier that includes a second operational amplifier 1238, third and fourth resistors 1241 and 1243, and a pair of complementary transistors 1240 and 1242. The second operational amplifier 1238 has inverting and noninverting inputs, respectively, indicated by the negative ("−") and positive ("+") signs. The noninverting input is coupled to ground. The inverting input is coupled to both the audio input terminal 1212 and the second operational amplifier 1238 output through a negative feedback network including the third and fourth resistors 1241 and 1243, to receive the input audio signal 1214. In this configuration the second operational amplifier 1238 produces a second operational amplifier output signal 1252 that is a voltage-amplified version of the input audio signal 1214. The voltage gain applied to the first input audio signal 1214 is equal to $-R_{1243}/R_{1241}$ where $R_{1241}$ is the resistance of the third resistor 1241 and $R_{1243}$ is the resistance of the fourth resistor 1243. Thus, the second operational amplifier 1238 not only amplifies the first input audio signal 1214, but it also inverts it. Accordingly, the second operational amplifier output signal 1252 has an inverse relationship with the input audio signal 1214. When the input audio signal 1214 is positive, the second operational amplifier output signal 1252 is negative, and when the input audio signal 1214 is negative, the second operational amplifier output signal 1252 is positive.

Typically the transistors 1240 and 1242 of the second push-pull amplifier output stage 1236 are npn and pnp bipolar junction transistors (BJTs), respectively, in common emitter configurations. The transistors 1240 and 1242 are also typically connected to a biasing network (not shown) to reduce the crossover distortion present in a strictly class B amplifier. The transistors 1240 and 1242 are connected so that when second operational amplifier output signal 1252 is positive, the first transistor 1240 conducts and pushes current into the second load 1244. When the second operational amplifier output signal 1252 is negative, the second transistor 1242 conducts and pulls current from the second load 1244. The positive power supply rail 1226 produced by the split power supply 1202 powers the first transistor 1240. The negative power supply rail 1228 produced by the split power supply 1202 powers the second transistor 1242. The transistors 1240 and 1242 work together to produce the second amplified output audio signal 1254 that is a current amplified version of the second operational amplifier output signal 1252.

The second load 1244 is coupled to the second audio output terminal 1250 in an inverted manner. Since the second amplified output audio signal 1254 is an inverted version of the input audio signal 1214, the corresponding load 1244 must be inverted so that the sound coming from second load 1244 is reproduced with correct polarity. Typically, inverting the load 1244 involves swapping the leads of the load 1244.

The power supply control circuit 1204 and the split power supply 1202 of FIG. 12 are configured to produce positive and negative power supply rails 1226 and 1228 that track the envelope or absolute value of the input audio signals 1214. The power supply control circuit 1204 tracks the input audio signal 1214 and produces a power supply control voltage 1230 that produces positive and negative power supply rails 1226 and 1228 with the specific amount of power required to produce the amplified output audio signals 1224 and 1254.

In this embodiment, the power supply control circuit 1204 does not need to compensate for poor cross-regulation since the power sources 1220 and 1222 of the split power supply 1202 are evenly loaded. The second operational amplifier output signal 1252 is an inverted version of the first operational amplifier output signal 1234, when the first operational amplifier output signal 1234 is high, the second operational amplifier output signal 1252 is low, and conversely when the first operational amplifier output signal 1234 is low, the second operational amplifier output signal 1252 is high. As a result, when the first transistor 1216 of the first push-pull amplifier output stage 1208 is "on", the second transistor 1242 of the second push-pull amplifier output stage 1236 is also "on." Similarly, when the second transistor 1218 of the first push-pull amplifier output stage 1208 is "on", the first transistor 1240 of the second push-pull amplifier output stage 1236 is also "on". In this scenario, an equal load is being applied to both power sources 1220 and 1222 at all times.

Figure 13:
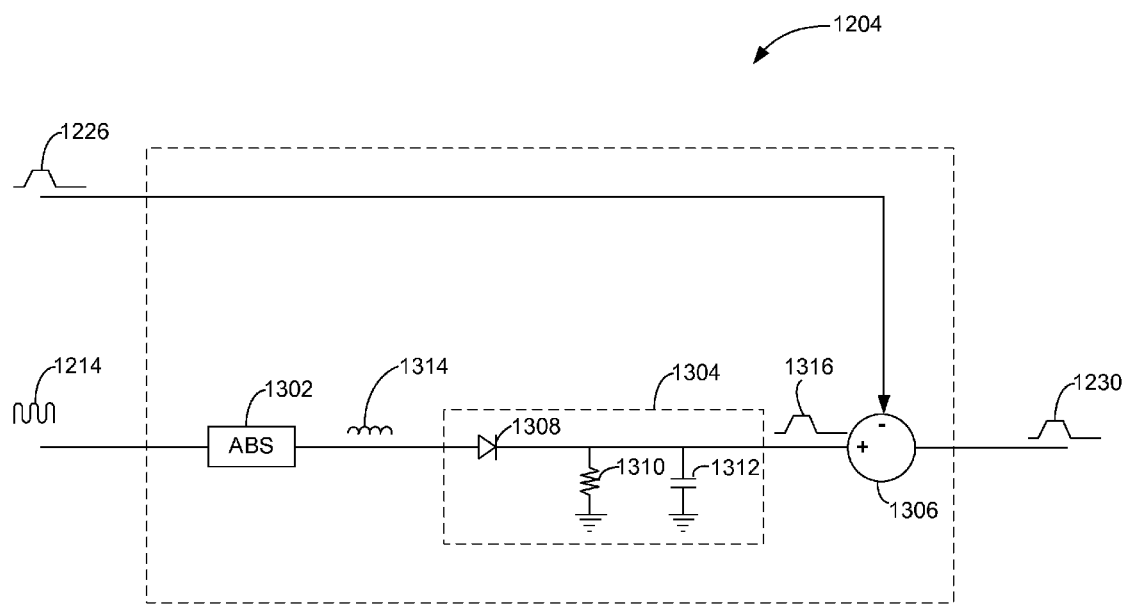
FIG. 13 is a circuit diagram of the power supply control circuit of FIG. 12 in accordance with at least one embodiment.

Reference is now made to FIG. 13, in which an exemplary embodiment of the power supply control circuit 1204 of FIG. 12 is illustrated. The power supply control circuit 1204 shown in FIG. 13 includes an absolute value block 1302, an envelope detector 1304 and a differential amplifier 1306.

The absolute value block 1302 is coupled to the audio input terminal 1212 and receives the input audio signal 1214. The absolute value block 1302 converts the received input audio signal 1214 into a rectified signal 1314.

The envelope detector 1304 takes the rectified signal 1314 and produces an envelope signal 1316, which is the envelope of the rectified signal 1314. The envelope detector 1304 may include a diode 1308, a resistor 1310 and a capacitor 1312. Capacitor 1312 and resistor 1310 are coupled in parallel between ground and the output of the absolute value block 1302 through diode 1308.

The rectified signal 1314 is received by the diode 1308 and once it exceeds the diode threshold it charges the capacitor 1312 to a voltage of $V_{peak}$, which is equal to the peak of the rectified signal 1314 less the diode drop. Once the rectified signal 1314 drops below the diode threshold, the capacitor 1312 discharges through the resistor 1310.

The envelope detector 1304 has a time constant τ equal to the product of $R_{1310}$ and $C_{1312}$ where $R_{1310}$ is the resistance of the resistor 1310 and $C_{1312}$ is the capacitance of the capacitor 1312. The time constant τ defines the rate at which the capacitor 1312 discharges. In a class H amplifier with a linear class AB output stage, such as amplifier 1200, it is preferred that the time constant τ be short so that the power supply rails 1226 and 1228 can closely track the falling input audio signal 1214 thereby minimizing the conduction losses in the transistors 1216, 1218, 1240, and 1242. In some embodiments, the time constant τ is in the range of 1 ms to 100 μs. This allows the power supply rails 1226 and 1228 to closely track input audio signal 1214 in the 0 HZ to 1 kHz range.

Other amplifiers, such as class D amplifiers, do not typically need to track the input audio signal 1214 so closely and thus do not require such a short time constant τ. In a class D amplifier the output transistors are switching thus they will have an order of magnitude lower conduction loss as compared to a linear AB amplifier. As a result, the input audio signal 1214 does not need to be so closely tracked to keep the efficiency high. All that is required in the class D amplifier is that the envelope is accurately tracked. Typically, tracking a 25 Hz signal is adequate for a class D amplifier. Accordingly, the time constant τ for a class D amplifier is typically 10 ms or longer.

The differential amplifier 1306 receives the envelope signal 1316 and the positive power supply rail 1226 and outputs the difference between the envelope signal 1316 and the positive power supply rail 1226 as an error signal known as the power supply control voltage 1230.

The present invention has been described here by way of example only. Various modifications and variations may be made to these exemplary embodiments without departing from the spirit and scope of the invention, which is limited only by the appended claims.

We claim:

1. An audio amplifier comprising:
    a first audio input terminal for receiving a first input audio signal;
    a first push-pull amplifier output stage for receiving the first input audio signal and producing a first amplified output audio signal;
    a split power supply for producing a positive power supply rail and a negative power supply rail in response to a power supply control voltage, the positive and negative power supply rails providing power to the first push-pull amplifier output stage;
    a power supply control circuit for generating the power supply control voltage, the power supply control voltage being based on the smaller of the positive and negative power supply rails and the first input audio signal; and a second push-pull amplifier output stage for receiving a first version of the first input audio signal and producing a second amplified output audio signal, the second push-pull amplifier output stage being powered by the positive and negative power supply rails.

2. The audio amplifier of claim 1, wherein the power supply control voltage cross regulates the positive power supply rail and the negative power supply rail.

3. The audio amplifier of claim 1, wherein the power supply control circuit comprises:
- an absolute value block for converting the first input audio signal into a rectified input audio signal;
- an envelope detector for producing an envelope signal from the rectified input audio signal;
- a comparator circuit for selecting the smaller of the positive and negative power supply rails; and
- a differential amplifier for generating the power supply control voltage, the power supply control voltage being the difference between the envelope signal and the selected power supply rail.

4. The audio amplifier of claim 1, further comprising a first voltage clamping device for capping the positive power supply rail at a first predetermined threshold, and a second voltage clamping device for capping the negative power supply rail at a second predetermined threshold.

5. The audio amplifier of claim 1, further comprising an active switching circuit for balancing the positive and negative power supply rails.

6. The audio amplifier of claim 5, further comprising an imbalance detector for enabling the active switching circuit when at least one of the positive and negative power supply rails exceeds a predetermined threshold.

7. The audio amplifier of claim 1, further comprising:
- a second audio input terminal for receiving a second input audio signal; and
- a third push-pull amplifier stage for receiving the second input audio signal and producing a third amplified output audio signal that is an inverted version of the second input audio signal, the third push-pull amplifier output stage being powered by the positive and negative power supply rails;
- wherein the power supply control voltage is based on the smaller of the positive and negative power supply rails, and the larger of the first input audio signal and the second input audio signal.

8. The audio amplifier of claim 7, wherein the power supply control circuit comprises:
- a first comparator circuit for rectifying the first and second input audio signals to produce rectified signals and selecting the larger of the rectified signals;
- an envelope detector for producing an envelope signal from the selected one of the rectified signals;
- a comparator circuit for selecting the smaller of the positive and negative power supply rails; and
- a differential amplifier for generating the power supply control voltage, the power supply control voltage being the difference between the envelope signal and the selected one of the positive and negative power supply rails.

9. The audio amplifier of claim 7, further comprising a pre-processing circuit for:
- filtering the first input audio input signal into a first high frequency signal and a first low frequency signal;
- filtering the second input audio input signal into a second high frequency signal and a second low frequency signal;
- combining the first low frequency signal and the second low frequency signal to produce a total low frequency signal; and
- adding the total low frequency signal to the first and second high frequency signals to produce modified first and second input audio signals.

10. The audio amplifier of claim 1, wherein the first version of the first input audio signal comprises a version of the first amplified output audio signal, the audio amplifier further comprising
- a differential amplifier for generating a second stage input signal, the second stage input signal being the difference between the first amplified output audio signal and the second amplified output audio signal; and
- a summer for generating the version of the first amplified output audio signal, the version of the first amplified output audio signal being the sum of the first input audio signal and the second stage input signal.

11. The audio amplifier of claim 1, wherein the first version of the first input audio signal comprises an inverted version of the first input audio signal, and wherein the power supply control circuit comprises
- an absolute value block for converting the first input audio signal into a rectified input audio signal;
- an envelope detector for producing an envelope signal from the rectified input audio signal; and
- a differential amplifier for generating the power supply control voltage, the power supply control voltage being the difference between the envelope signal and the positive power supply rail.

* * * * *